United States Patent [19]

Ward et al.

[11] Patent Number: 5,709,756
[45] Date of Patent: Jan. 20, 1998

[54] BASIC STRIPPING AND CLEANING COMPOSITION

[75] Inventors: Irl E. Ward, Bethlehem; Francis W. Michelotti, Easton, both of Pa.; Darryl W. Peters, Stewartsville, N.J.

[73] Assignee: Ashland Inc., Dublin, Ohio

[21] Appl. No.: 744,013

[22] Filed: Nov. 5, 1996

[51] Int. Cl.⁶ ........................... H01L 21/302; B08B 3/08
[52] U.S. Cl. .................. 134/1.3; 252/79.4; 252/79.3; 156/659.1
[58] Field of Search ................... 252/79.1, 79.2, 252/79.3, 79.4; 134/1.3; 216/90; 156/659.1

[56] References Cited

U.S. PATENT DOCUMENTS

| | | | |
|---|---|---|---|
| 4,230,523 | 10/1980 | Gajda | 156/657 |
| 5,279,771 | 1/1994 | Lee | 252/548 |
| 5,320,709 | 6/1994 | Bowden et al. | 156/667 |
| 5,334,332 | 8/1994 | Lee | 252/548 |
| 5,417,877 | 5/1995 | Ward | 252/153 |
| 5,419,779 | 5/1995 | Ward | 134/38 |
| 5,482,566 | 1/1996 | Lee | 134/42 |
| 5,556,482 | 9/1996 | Ward et al. | 134/38 |

FOREIGN PATENT DOCUMENTS 024123  6/1974  Japan.

*Primary Examiner*—R. Bruce Breneman
*Assistant Examiner*—George Goudreau
*Attorney, Agent, or Firm*—John Lezdey

[57] ABSTRACT

An aqueous and basic stripping and cleaning composition is provided which contains a hydroxylamine, ammonium fluoride, water and optionally DMSO. The pH of the composition is greater than about 8. Also provided is a method of stripping and cleaning utilizing the compositions of the invention.

11 Claims, No Drawings

BASIC STRIPPING AND CLEANING COMPOSITION

FIELD OF THE INVENTION

The invention relates generally to a stripping and cleaning composition having a controlled oxide etch and sidewall polymer removal capability and to a process for stripping and etching utilizing the composition. More particularly, the invention provides a basic stripping composition containing ammonium fluoride and hydroxylamine.

BRIEF DESCRIPTION OF THE PRIOR ART

In fabricating semiconductor devices it is the practice to passivate and protect the surface of a body of silicon material with a layer or superimposed layers of inorganic insulating materials, such as silicon dioxide, silicon nitride, etc.

Openings are made through these protective layers to the silicon body both to provide impurity regions within the body as well as to allow conductive layers on top of the body to make contact to the impurity regions. In most instances it is important that the etchant be selective, i.e., it exhibits the property of attacking the silicon or the other protective layer. For example, dilute hydrofluoric acid buffered with ammonium fluoride has been used to etch silicon dioxide because it does not substantially attack silicon nitride or silicon. Similarly, hot phosphoric acid will attack silicon nitride while not attacking silicon dioxide, silicon or common photoresist layers.

However, the standard buffered HF solution will attack $N^+$ or $n^-$ type silicon during semiconductor processing. This is particularly true when the etching solution is in contact simultaneously with exposed highly doped silicon and platinum silicide. The cause is apparently an electrochemical reaction between the silicon and the platinum silicide, with the reaction connection being completed when the semiconductor is dipped into the standard buffered HF solution. This tends to dissolve the silicon, especially $N^+$ silicon.

U.S. Pat. No. 5,334,332 to Lee discloses aqueous cleaning compositions containing a hydroxylamine, an alkanol amine and a chelating agent.

Kinsbron et al, U.S. Pat. No. 4,343,677 discuss film patterning and disclose an etching solution which uses buffered ammonium fluoride/hydrofluoric acid in a molar ratio of about ten to one, mixed with a suitable solvent such as ethylene glycol. Gajda, U.S. Pat. No. 4,230,523, discloses an etchant comprised of a solution of hydrogen fluoride dissolved in organic solvents such as glycerine or another polyhydric alcohol. The etchant is used for etching silicon dioxide while not attacking silicon. Gajda requires that the solution be free of unbound water and ammonium fluoride. Maeda et al, U.S. Pat. No. 3,979,241, teach an etching liquid with ammonium fluoride or an alkali fluoride dissolved in a polyhydric alcohol, such as ethylene glycol, polyethylene glycol, and glycerine. The etching solution is used for selectively etching silicon dioxide or silicon nitride on a semiconductor wafer.

U.S. Pat. No. 5,320,709 to Bowden et al discloses a composition for selectively removing oxidized organometallic residues, oxidized organosilicone residues and oxides with a composition which is essentially neutral and comprises a polyhydric alcohol and an anhydrous ammonium fluoride salt. The present invention provides a specific improvement over the compositions of this patent by utilizing aqueous ammonium fluoride, hydroxylamine, and optionally dimethylsulfoxide (DMSO).

SUMMARY OF THE INVENTION

The present invention provides an aqueous basic stripping and cleaning composition for the removal of organic materials, organometallic residues, organosilicone residues, sidewall polymer (SWP) and inorganic residues which has a controlled oxide etch rate. The composition which has a pH of more than 8 comprises the admixture of:

a) about 1 to 20% by weight of ammonium fluoride;

b) about 25 to 48% by weight of a hydroxylamine, and c) water.

Optionally, the composition may contain up to about 25% by weight dimethylsulfoxide (DMSO).

Generally, the ammonium fluoride is used as a 40% aqueous solution and the hydroxylamine is used as a 50% aqueous solution.

The compositions of the inventions are suitable for both VIA and contact hole applications as well as connector lead/multi-layer metal stack applications due to their high resistance to metal and metal alloy corrosion.

Advantageously, the compositions of the invention are free of hydrofluoric acid.

The compositions of the invention may contain a corrosion inhibitor.

It is a general object of the invention to provide a cleaning and stripping composition having a controlled etch and sidewall polymer removal capability.

It is another object of the invention to provide a stripping composition which is free of hydrofluoric acid.

It is yet another object of the invention to provide a stripping composition which is water soluble having high resistance to metal corrosion.

It is still another objection of the invention to provide a cleaning composition which removes inorganic and ash residues.

It is still another objection of the invention to provide a method for stripping which provides for a silicone or controlled oxide etch.

The advantages and further objects of the invention will become more apparent from the following description of the preferred embodiments.

DESCRIPTION OF THE PREFERRED EMBODIMENTS

The present invention is directed to a basic stripping and cleaning composition comprises a hydroxylamine, ammonium fluoride, water and optionally dimethylsulfoxide. The composition has a pH of more than about 8. Advantageously, the composition contains a corrosion inhibitor which forms a 5- or 6-membered ring coordination complex with a metal substrate as described in U.S. Pat. No. 5,417,877.

The compositions of the present invention are particularly suitable for removing organic or inorganic material from a substrate such as sidewall polymers (SWP) and/or for controlled etching of contaminated or uncontaminated oxide surfaces. The composition are also effective in removing many forms of resist ash and etch residues without the presence of hydrogen fluoride.

Ammonium fluoride is commercially available as a 40% aqueous solution.

The hydroxylamine compounds useful in the present invention are hydroxylamine, hydroxylamine acid addition salts and lower alkyl derivatives such as N-methylhydroxylamine.

Corrosion inhibitors in an amount of up to about 15% by weight can be added to the stripping compositions.

Preferably, the inhibitor concentration is from about 0.5 to 8% by weight, and most preferably, about 5% by weight. Suitable inhibitors are disclosed in U.S. Pat. No. 5,417,877 to Ward, which is herein incorporated by reference. The inhibitor is a compound selected from the group consisting of:

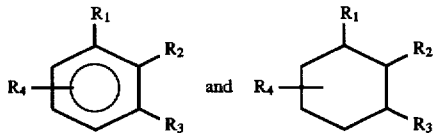

wherein $R_1$, $R_2$, $R_3$ and $R_4$ are the same or different and each represent H, OH, $NHR_5$, $CO_2R_6$, $COR_7$ and SH, wherein $R_5$ and $R_6$ are the same or different and each represent H or lower alkyl, and $R_7$ represents lower alkyl, with the proviso that when $R_4$ is H, not more than one of $R_1$, $R_2$, $R_3$ is the same as $R_4$, and when $R_3$ is not H, not more than one of $R_1$, $R_2$ and $R_4$ is hydrogen, the remainder being the same or different than $R_3$. Preferred inhibitors include catechol, pyrogallol, anthranilic acid, gallic acid, gallic esters, and the like.

The compositions of this invention are especially useful and advantageous for numerous reasons among which may be mentioned the following. The compositions are water soluble, non-corrosive to substrate, non-flammable and of low toxicity to the environment. The compositions evidence high stripping efficiency at low temperatures for a wide variety of coating residues and substrates. The compositions are particularly suitable for removal of residues from plasma processing used in integrated circuit fabrication since they also prevent the redeposition of metal ions, especially sodium and potassium ions and have a faster more complete removal of trace metals. The compositions provide controlled oxide etch and controlled silicone and/or polysilicone etch.

The process of the invention is carried out by contacting a substrate containing an organic or metal-organic polymer, inorganic salt, oxide, hydroxide or complex or combination thereof as a film or residue, (e.g. sidewall polymer (SWP)), with the described stripping composition. The actual conditions, e.g., temperature, time, etc., depend on the nature and thickness of the complex (photoresist and/or SWP) material to be removed, as well as other factors familiar to those skilled in the art. In general, for stripping, the substrate is contacted or dipped into a vessel containing the stripping composition at an elevated temperature, preferably between 25°–80° C. and usually about 60°C. for a period of about 1–15 minutes and then washed with water.

Representative organic polymeric materials include positive photoresists, electron beam resists, X-ray resists, ion beam resists, and the like. Specific examples of organic polymeric materials include positive resists containing phenolformaldehyde resins or poly (p-vinylphenol), polymethylmethacrylate-containing resists, and the like. Examples of plasma processing residues side wall polymers (SWP) include among others, metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, aluminum, aluminum alloys, copper, copper alloys, etc.

Examples illustrating the removal of a coating from a substrate under varying conditions are described further below. The following examples are provided to further illustrate the invention and are not intended to limit the scope of the present invention.

Examples of compositions according to the invention are set forth below in Table I. The amounts indicated are in percent by weight of composition.

TABLE I

| Stripping Compositions | 50% aq. Hydroxyl-amine | DMSO (wt %) | 40% aq. Ammonium Fluorine | pH 50% aq. solution | ER tox @ RT (Å/min) |
|---|---|---|---|---|---|
| A | 95.0 | 0 | 5.0 | 8.7 | 0 |
| B | 80.0 | 0 | 20.0 | 8.4 | 0 |
| C | 60.0 | 20.0 | 20.0 | 8.0 | 0 |

EXAMPLE I

Compositions of the invention were prepared which comprised:

| Ingredient | % Wt. |
|---|---|
| A. | |
| 40% aqueous ammonium fluoride | 2.0 |
| 50% aqueous hydroxylamine | 47.5 |
| Water | 50.5 |
| B. | |
| 40% aqueous ammonium fluoride | 8.0 |
| 50% aqueous hydroxylamine | 40.0 |
| Water | 52.0 |

The compositions are useful as stripping and cleaning compositions for photoresists.

EXAMPLE II

A stripping and cleaning composition was prepared by admixing the following ingredients:

| Ingredient | % Wt. |
|---|---|
| 50% aqueous hydroxylamine | 80.0 |
| DMSO | 10.0 |
| 40% aqueous ammonium fluoride | 5.0 |
| Pyrogallol | 5.0 |

The pH of the composition was about 8.

EXAMPLE III

A stripping and cleaning composition was prepared by admixing the following ingredients:

| Ingredient | % Wt. |
|---|---|
| 50% aqueous hydroxylamine | 80.0 |
| 40% aqueous ammonium fluoride | 18.0 |
| Catechol | 2.0 |

The pH of the composition was 8.2.

EXAMPLE IV

Example IV illustrates the removal of a photoresist from a substrate using a stripping composition of the invention.

More specifically, an immersion tank containing composition A of Table I is held at room temperature and the stripping composition is recirculated at an exchange rate of about 1.0 (i.e. pump flow rate/bath volume≈1.0).

A rinse tank with standard overflow cascade containing deionized water with a $CO_2$ sparge is also prepared.

The photoresist wafer specimen is immersed into the stripping composition for 1–20 minutes in accordance with the oxide etch rate and the amount of removal desired.

The specimen is removed from the stripping bath and immersed into the rinse tank for 2–4 minutes using continuous $CO_2$ sparging.

The specimen is then removed and spun dry in a heated nitrogen atmosphere.

What is claimed is:

1. An aqueous and basic stripping and cleaning composition comprising the admixture of:
   a) about 25 to 48% by weight of a hydroxylamine;
   b) about 1 to 20% by weight of ammonium fluoride; and
   c) the remainder being water; said composition having a pH greater than about 8.

2. The composition of claim 1 which includes up to about 25% of dimethylsulfoxide.

3. The composition of claim 1 including a corrosion inhibitor.

4. The composition of claim 3 wherein said inhibitor is selected from the group consisting of catechol, pyrogallol, gallic acid and anthranilic acid.

5. The composition of claim 1 consisting of dimethylsulfoxide, ammonium fluoride, hydroxylamine, a corrosion inhibitor and water.

6. A process for stripping and cleaning an organic coating from a coated substrate which comprises subjecting said coated substrate to a composition according to claim 1 for a period of time to strip organic material from said substrate.

7. The process of claim 6 wherein said process is conducted at a temperature between about ambient to 80° C.

8. The process of claim 7 wherein said coated substrate is a photoresist.

9. A process for stripping and cleaning an organic coating from a coated substrate which comprises subjecting said coated substrate to a composition according to claim 3 for a stripping effective time.

10. The process of claim 9 wherein said process is conducted at a temperature between about ambient to 80° C.

11. A process for stripping and cleaning an organic coating from a coated substrate which comprises subjecting said coated substrate to a composition according to claim 5 at an elevated temperature for a stripping effective time.

* * * * *